United States Patent [19]

McGalliard

[11] 4,394,639
[45] Jul. 19, 1983

[54] PRINTED CIRCUIT FUSE ASSEMBLY

[76] Inventor: James D. McGalliard, 11171 Fenwick Pl., Santa Ana, Calif. 92705

[21] Appl. No.: 267,704

[22] Filed: May 28, 1981

Related U.S. Application Data

[62] Division of Ser. No. 970,632, Dec. 18, 1978, Pat. No. 4,296,398.

[51] Int. Cl.³ .............................................. H01H 85/04
[52] U.S. Cl. .................................... 337/292; 337/297; 337/4; 361/104
[58] Field of Search ................... 337/4, 292, 297, 293, 337/283, 284; 361/104, 400, 404, 408, 431, 41; 340/638, 639; 174/68.5; 357/45, 41; 219/517

[56] References Cited

U.S. PATENT DOCUMENTS

| 3,353,066 | 11/1967 | De Souza | 361/55 |
| 3,693,048 | 9/1972 | Doversberger et al. | 337/4 |
| 3,835,294 | 9/1974 | Krohn et al. | 219/517 |
| 4,002,949 | 1/1977 | Westrom | 361/41 |

FOREIGN PATENT DOCUMENTS 298375 1/1930 Fed. Rep. of Germany ...... 361/104

OTHER PUBLICATIONS

IBM Technical Disclosure Bulletin, vol. 19, No. 5, Oct. 1976, "Protection of Printed-Circuit Cards".

Primary Examiner—Harold Broome
Attorney, Agent, or Firm—Knobbe, Martens, Olson & Bear

[57] ABSTRACT

A circuit fuse assembly comprising a plurality of fuse elements which are simultaneously formed using printed circuit or through hole plating techniques and including means for easily substituting a different one of the plural fuse elements when the in-circuit fuse element burns out due to an overload current condition. In the preferred embodiment, the fuse assembly is (a) integrally formed with the printed circuit of the fused electrical apparatus and (b) formed with a common electrical connection such that a single electrical bridge of solder or other means enables substitution of a replacement fuse element. Other embodiments of the present invention provide a restorable printed circuit fuse for use in standard fuse holders, in-line plug connectors, conventional three prong plug connectors, edison bases, and plug-in triple outlets.

4 Claims, 37 Drawing Figures

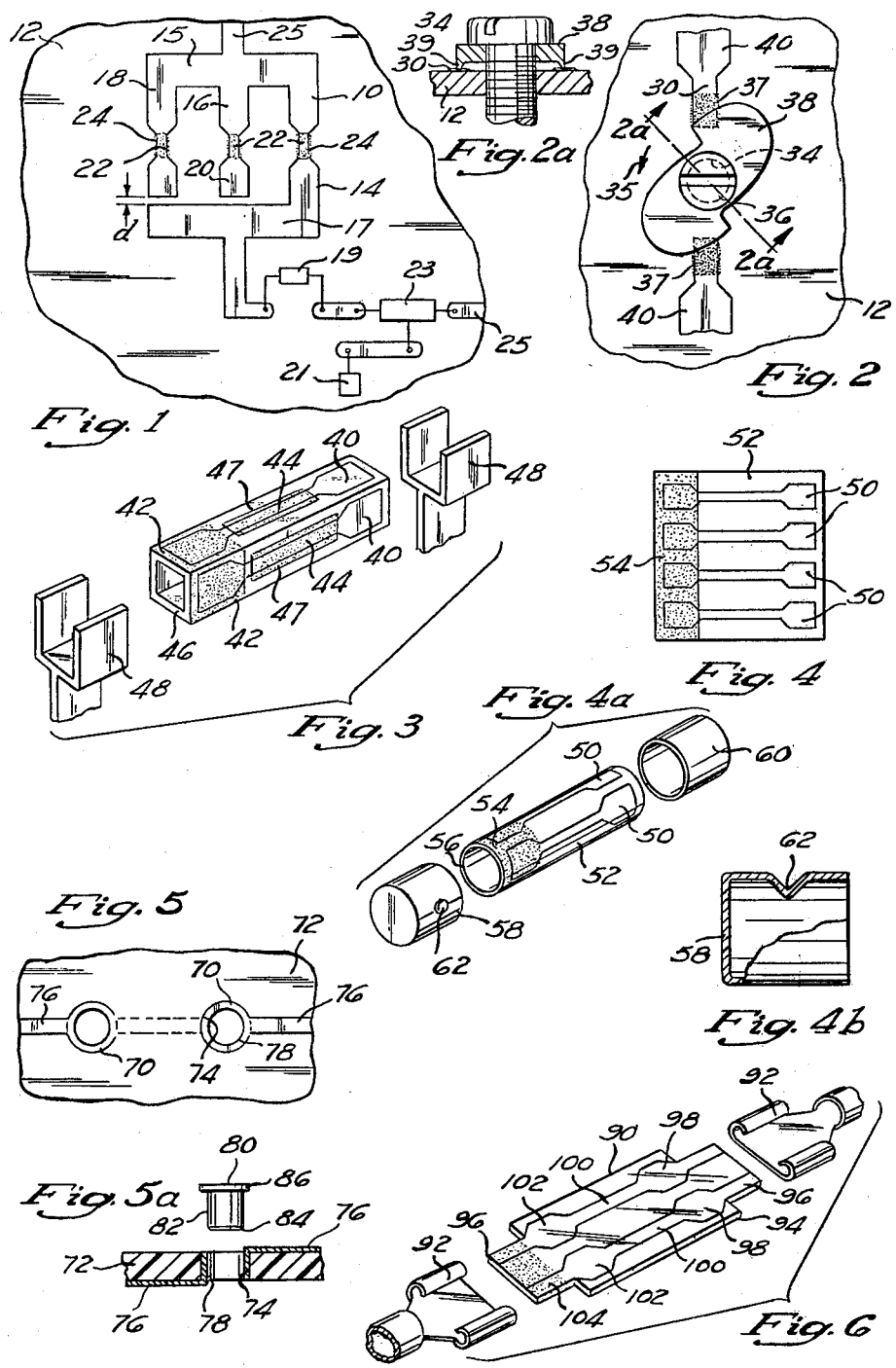

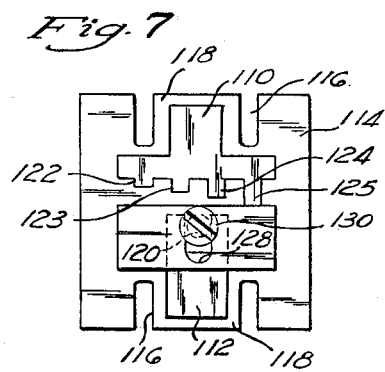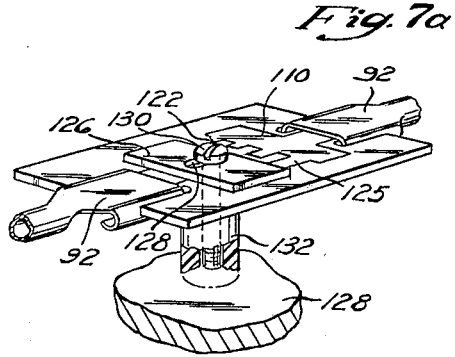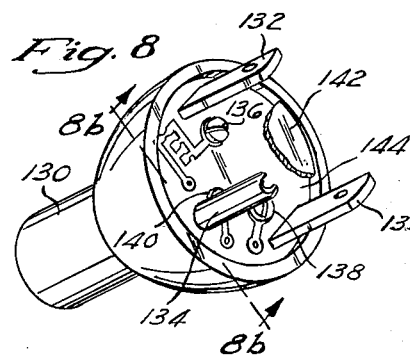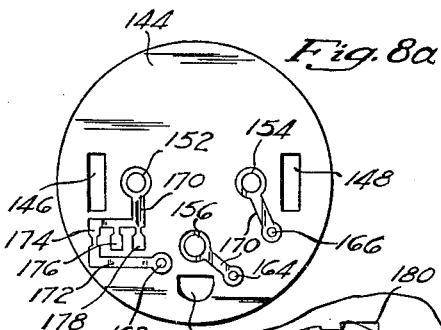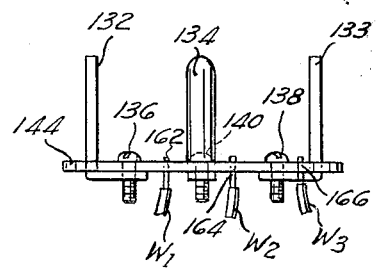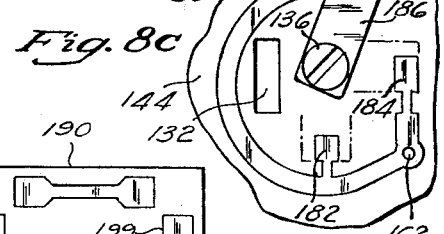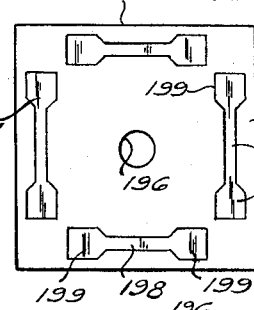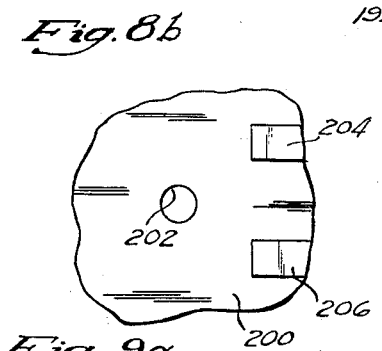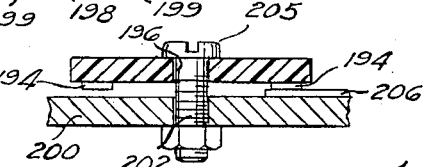

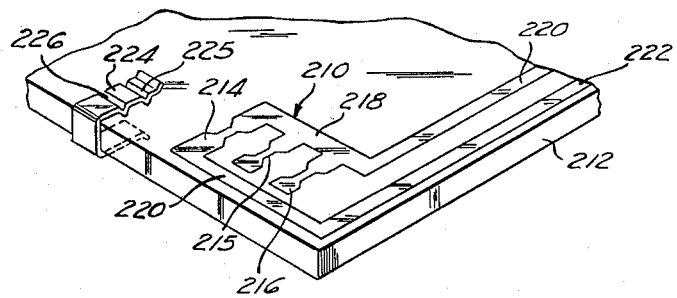
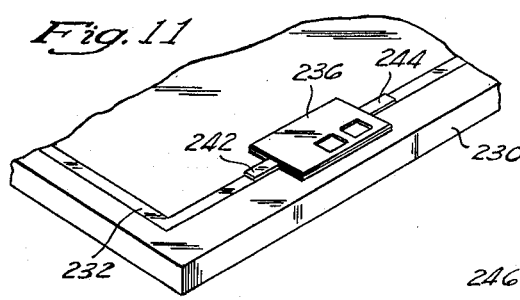
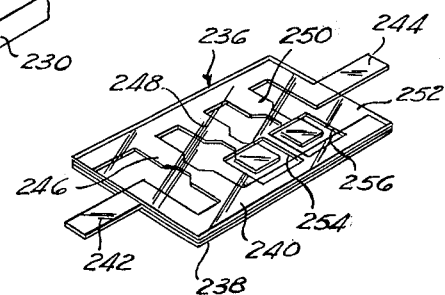
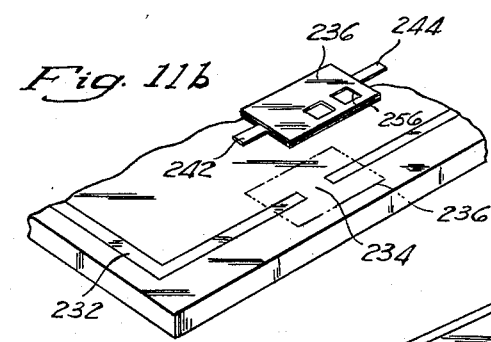
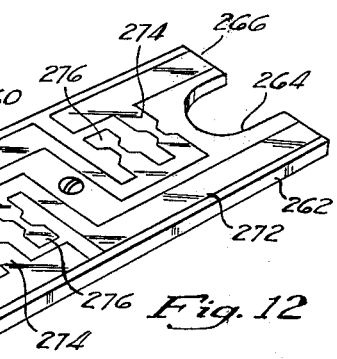
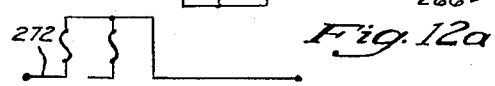

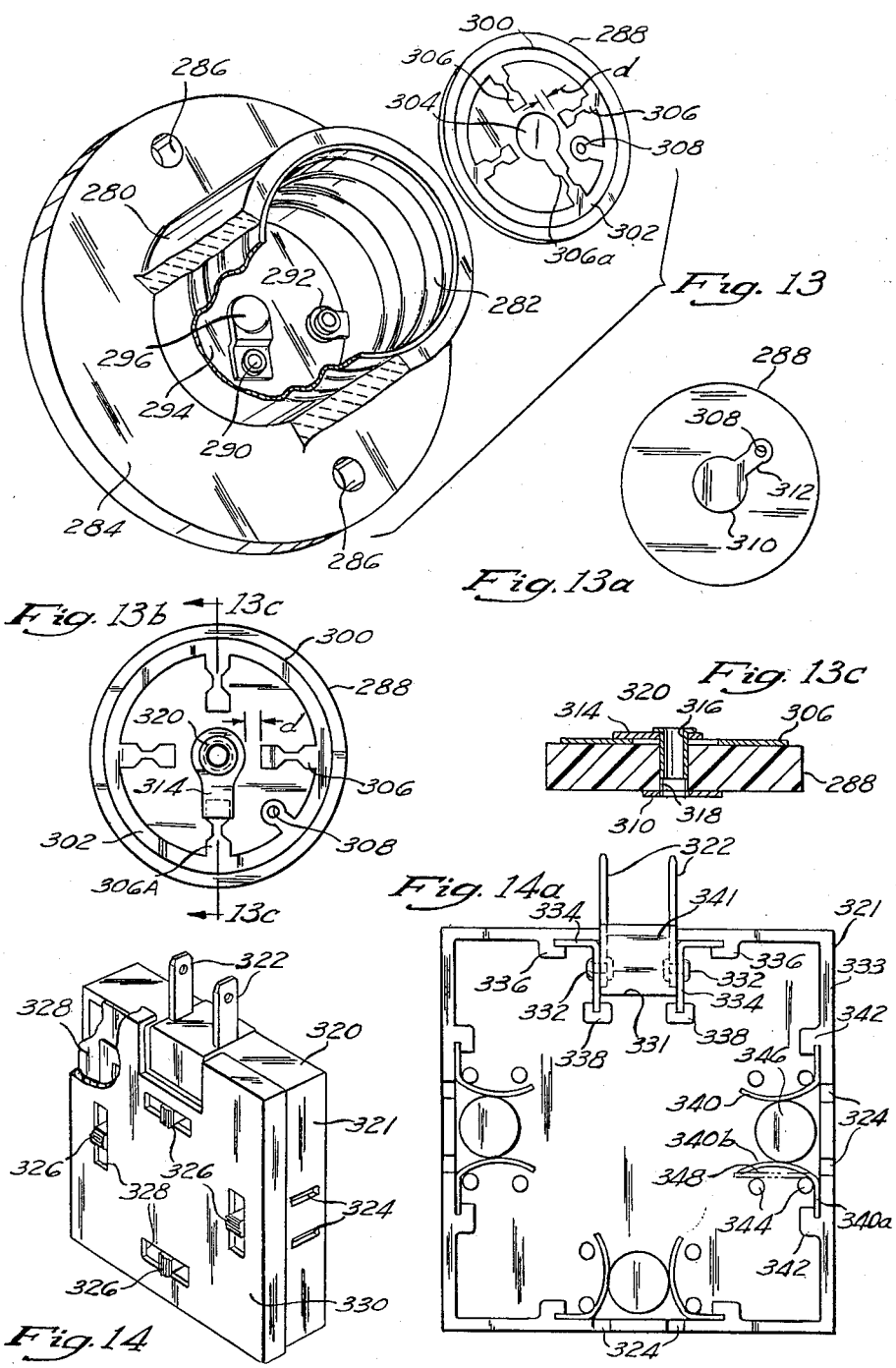

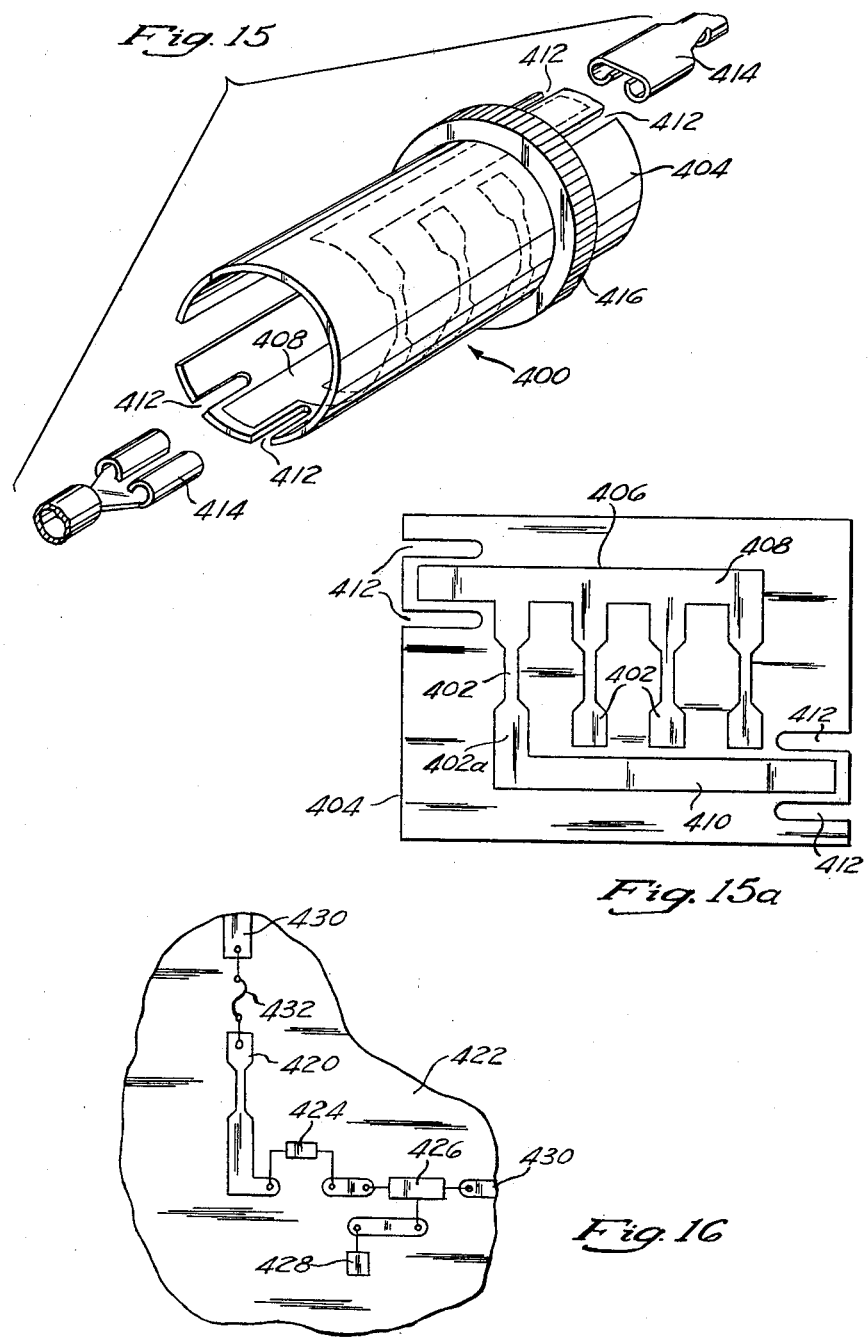

PRINTED CIRCUIT FUSE ASSEMBLY

This application is a division of application Ser. No. 970,632, filed Dec. 18, 1978 now U.S. Pat. No. 4,296,398.

BACKGROUND OF THE INVENTION

It is well known that in electrical circuitry it is advisable and often necessary to provide a fuse or circuit breaker to protect the circuit from abnormally high current values. In the majority of applications, fuses rather than circuit breakers have been utilized due to their smaller relative size and lower unit cost.

Prior art fuses have typically comprised a thin wire fuse element encased in a glass shell which is connected at both ends thereof to cap terminals. Normally, these fuses are supported by a spring clip receptacle located in a convenient place on the chassis of the device to provide easy access for manual replacement.

Although these prior art fuses have proven useful in their limited prior art applications, they are relatively expensive and subject to misuse and the problem of storing spare fuses.

In particular, with the development and widespread use of printed circuit boards, which are mass produced at a fraction of the cost of hand wired circuitry, the prior art fuse adds substantially to the manufacturing cost of the completed electrical circuitry.

The costs associated with the prior art fuse lie not only in the actual cost of the fuse and holder itself, but primarily in the labor costs incurred in the mounting and wiring of the fuse holder into the circuit. Typically, these fuse holders are mounted at a remote location on the circuit board itself or alternatively on the chassis of the electrical device. In either instance, the mounting of the fuse and holder requires the circuit board or chassis to be provided with a mounting hole or bracket onto which the fuse holder is mounted and subsequently wired. This mounting and wiring is normally facilitated by hand labor and thus substantially increases the production cost.

The use of these prior art fuses has also proven to be unsatisfactory from a manufacturer's viewpoint due to their inability to prevent consumer misuse of the device. Thus, consumers may accidentally or deliberately exchange these fuses with an overrated replacement, thereby causing damage to the electrical device. Similarly, in the case of such use of an overrated fuse, the consumer in an attempt to conceal such misuse may subsequently replace the overrated fuse with a proper fuse and claim a manufacturing defect. In the latter instance, the use of the prior art fuse fails to provide a history to the manufacturer of the deliberate misuse by the consumer.

Additionally, these prior art fuses have also proven deficient from a consumer's standpoint since in order to avoid prolonged nonuse of a particular device caused by fuse burnout, the consumer must store a variety of different rated replacement fuses.

SUMMARY OF THE PRESENT INVENTION

The present invention alleviates the cost, misuse and storage deficiencies associated in the prior art by providing a multiple printed circuit fuse assembly which in the preferred embodiment is formed directly on the mother or primary printed circuit board of the device with a common electrical connection to the multiple fuse elements. This fuse assembly has several significant advantages. It can be manufactured at a negligible cost increase and may be refused or restored by the user or service technician by simply flowing solder at a particular location on the circuit board. Since the multiple fuse is printed on the mother circuit board itself, the consumer cannot misuse the device by changing the fuse rating. Additionally, the printed circuit fuse is conducive to mass production techniques and provides a highly accurate current limiting value. Further, since the fuse element is bonded directly on the circuit board itself, even after burnout a permanent record or history of consumer use is provided for the manufacturer or seller.

In an alternative embodiment, the printed circuit fuse assembly is provided with a movable or cammed shorting bar which allows the fuse to be restored by the user after initial burnout by simply moving the shorting bar to another position on the fuse element.

In another embodiment, the fusing of the electrical circuit is accomplished by use of a thru hole plating technique on the printed circuit board itself with multiple fusing being accomplished by the simple insertion of a shorting button into the burned fuse.

The present invention additionally provides a printed circuit fuse assembly having multiple fuse elements which may be utilized as a low cost replacement in the standard prior art cylindrical fuse holder which thereby eliminates the need for fuse storage by the consumer.

Further, in another embodiment, a multiple element "in-line" printed circuit fuse assembly is provided which may be utilized in a standard "fast-on" plug connector. Additionally, the present invention provides an inexpensive multiple fuse printed circuit board which may be built into a standard electrical appliance male and female plug connector as well as a plug-in triple outlet.

BRIEF DESCRIPTION OF THE DRAWINGS

FIG. 1 illustrates one form of the printed circuit fuse assembly of the present invention wherein a multiple fuse element is formed directly upon a printed circuit board of an electrical device;

FIG. 2 illustrates an alternative form of the present invention wherein a cammed shorting bar is utilized to re-fuse the printed circuit fuse assembly;

FIG. 2a is a cross sectional view of the cammed shorting bar of FIG. 2 taken along lines 2a—2a.

FIG. 3 is a perspective view of the multiple printed circuit board fuse assembly of the present invention formed into a square channel and received by two spring contacts;

FIG. 4 is a plan view of a multiple fuse assembly printed onto a flexible substrate;

FIG. 4a is an exploded view of the flexible substrate of FIG. 4 wrapped around a cylindrical mandrel and showing the assembly of the fixed and removable end caps;

FIG. 4b is an enlarged cross-sectional view of the removable end cap of FIG. 4a showing the indent contact;

FIG. 5 is a plan view of two printed circuit fuses of the present invention formed by an alternative method of through hole plating the circuit board;

FIG. 5a is a cross-sectional view of one of the through hole plated fuses of FIG. 5 showing the assembly of the shorting button used for restoring the circuit;

FIG. 6 is a perspective view of a multiple printed circuit fuse assembly of the present invention adapted to be inserted into a "fast-on" plug connector;

FIG. 7 is a plan view of a multiple printed fuse element of the present invention adapted to be inserted into a "fast-on" plug and having a movable shorting bar;

FIG. 7a is a perspective view of the multiple fuse element of FIG. 7 having a plurality of electrically isolated fuse circuits inserted into two "fast-on" plug connectors and illustrating the detailed construction of the shorting bar mechanism;

FIG. 8 is a perspective view of a standard plug connection modified by a printed circuit board utilizing a multiple printed circuit fuse;

FIG. 8a is an enlarged plan view of the printed circuit board of FIG. 8 showing the detailed printed circuitry and fuse elements thereon;

FIG. 8b is a cross-sectional view of the plug of FIG. 8 taken along lines b—b;

FIG. 8c is an enlarged fragmentary view of an alternative printed circuit board for use in the plug connector of FIG. 8 wherein a movable shorting bar is utilized to reactivate the multiple printed circuit fuse elements;

FIG. 9 is a plan view of a printed fuse module for mounting upon a printed circuit board constructed in accordance with this invention;

FIG. 9a is a fragmentary view of a printed circuit board modified to receive the printed fuse module of FIG. 9;

FIG. 9b is an enlarged cross-sectional view of the assembly of the multiple fuse module of FIG. 9 and the modified circuit board of FIG. 9b;

FIG. 10 is a fragmentary perspective view of a printed circuit board having formed thereon the multiple fuse element of the present invention positioned adjacent one edge thereof and provided with a contact clip;

FIG. 11 is a partial perspective view of a printed circuit board including the printed circuit fuse patch of the present invention;

FIG. 11a is an enlarged perspective view of the fuse patch of FIG. 11, illustrating the laminated construction thereof;

FIG. 11b is an exploded view of FIG. 11, illustrating the manner in which the fuse patch is located on the printed circuit board;

FIG. 12 is an enlarged perspective of a dual in line printed fuse module of the present invention;

FIG. 12a is a schematic diagram of the dual fuse circuits of FIG. 12;

FIG. 13 is an exploded view of a standard edison base outlet modified by a printed circuit fuse disc of the present invention;

FIG. 13a is a plan view of the fuse disc of FIG. 13 showing the detail construction of the undersurface thereof;

FIG. 13b is a plan view of a modified form of the fuse disc of FIG. 13 provided with a shorting bar for restoring the multiple printed fuse elements;

FIG. 13c is a cross-sectional view of the fuse disc of FIG. 13b taken along lines 13c—13c;

FIG. 14 is a perspective view, partially broken away, of a "plug-in" triple outlet modified by the printed circuit fuse of the present invention;

FIG. 14a is a plan view of the base member of the plug in outlet of FIG. 14 showing the detail interior construction thereof;

FIG. 15 is a perspective view of an in-line fuse roll constructed in accordance with the present invention;

FIG. 15a is a plan view of the "in-line" fuse roll of FIG. 15 showing the printed fuse circuit formed thereon; and FIG. 16 illustrates one form of the present invention wherein a printed circuit fuse is combined with a conventional fuse element to provide a permanent consumer misuse history.

DETAILED DESCRIPTION OF THE PREFERRED EMBODIMENT

Figure 14B:
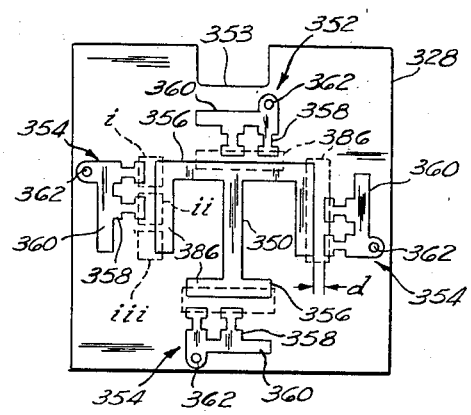
FIG. 14b is a plan view of the top surface of the printed circuitboard utilized in plug outlet of FIG. 14 showing the printed circuit fuse elements formed thereon.

Referring to FIG. 1, a multiple fuse assembly 10 is formed directly upon a mother or primary printed circuit board 12. Typically, the circuit board 12 is composed of a phenolic resin material, then fiberglass sheet, or a flexible polymer material, which is relatively inexpensive to fabricate and serves as an electrical insulator. The printed circuit board 12 typically supports a plurality of electrical components such as a resistor 19, a capacitor 21, an integrated circuit 23 or the like, which are connected together to provide an electronic apparatus or device by means of a printed circuit 25.

The actual formation of the printed circuit fuse assembly 10 upon the printed circuit board 12 is advantageously accomplished in the same manner as the printed circuit wherein a thin conductive foil is formed by one of several well-known procedures including etch resistant photography, silk screening, stamping or a bonding process. Note further that in this embodiment the multiple fuse assembly 10 is advantageously formed at the same time and with the same process as used in the manufacturing of the entire printed circuit 25, irrespective of the particular formation procedure utilized.

In the emobidment of FIG. 1, the printed fuse assembly 10 comprises three individual fuse elements 14, 16 and 18 as well as two fuse buses 15 and 17 which are connected in series to the lead for which fuse protection is desired. It should be noted that, by way of example, FIG. 1 illustrates a particular tri-fuse assembly, however, a single fuse or multiple fuse assembly may be formed without departing from the spirit of the invention. The plural fuse elements 14, 16, and 18 are advantageously formed with a common electrical connection to substantially facilitate substitution of a replacement fuse. Thus, in this embodiment, each of the fuse elements are joined in a parallel circuit configuration at one end thereof to the bus 15. Fuse element 14, however, is the only element which shunts the fuse buses 15 and 17; the fuse elements 16 and 18 being separated from the bus 17 by a small gap (d) at their lower end. Thus, as will be described in more detail, the fuse elements 16 and 18 are redundant or substitute back-up fuse members, each of which may be manually connected across the buses 15 and 17 by means of a single electrical bridge as described below to reactivate the circuit after fuse burnout.

The fuse elements 14, 16 and 18 are preferably formed having a land portion 20 at both ends thereof and a central neck portion 22, the width of the land 20 being substantially greater than that of the neck 22.

The current carrying capacity of amperage rating of each of the fuse elements 14, 16 and 18 are a function of the melting point of the particular conductor as well as the width and thickness of the neck section 22. Since the melting point of the conductor is a constant, the width and thickness of the neck 22, therefore, are determative of the fuse amperage rating. Both of these factors (i.e., the thickness and width of the neck 22) may be accurately controlled; the thickness of the conductor layer during production of the printed circuit and the width of the neck 22 during the original artwork layout of the circuit board. Thus, a highly accurate fuse rating may be obtained, with the only limitation on the current amperage rating being the space available on the circuit board 12 itself.

Additionally, it should be noted that although for illustrative purposes the fuse elements are depicted having a generally elongated shape with a uniform thickness and reduced width at the neck section, the elements may be formed in a variety of configurations. Further the fuse element may be fabricated having a reduced thickness rather than width, or formed of two materials of differing melting points, or provided with heat sinks at various locations along its length and still function in the manner described herein.

Fuse Burnout and Vaporization

During the operation of the electronic apparatus which incorporates the fuse assembly 10, current passes through the neck 22 of the fuse element 14. This current flow causes heat to be generated at the neck 22. If the current in the circuit lead which includes the fuse rises above the rated value of the fuse element 14, the generated heat causes the neck 22 to burn out or vaporize thereby breaking the circuit.

To prevent the possibility of metal particles being freed during melting of the neck section 22 and being deposited at undesirable locations on the printed circuit board, the neck section 22 of each fuse element 14, 16 and 18 is preferably provided with a small covering of dielectric or other suitable material 24 (indicated by the shaded area in FIG. 1) which effectively maintains any burnoff within the vicinity of the element itself. Further, this dielectric material may advantageously contain or be coated with a temperature sensitive film which changes color permanently in response the extreme temperature increases. Thus upon burnout, the change in color adjacent the neck portion of the fuse element will earmark or signal the particular fuse element which has been burnt to the service technician or user. Additionally, applicant has discovered that by making the width of the land 20 relatively large in comparison with the width of the neck 22, clean vaporization of the neck 22 during burnout is enhanced, thereby decreasing the incidence of freed metal particles.

After burnout, reactivation or re-fusing of the circuit may be accomplished by the consumer or service technician by simply connecting either of the redundant fuse elements 16 or 18 into the electronic circuit. Typically, this connection may be easily and quickly facilitated by flowing hot solder across the gap (d), however, other means of electrically bridging across the gap (d) may be utilized. It will be recognized that if excessive current values subsequently develop in the circuit causing the fuse elements 16 or 18 previously soldered into the circuit to burnout, the remaining redundant fuse elements 16 or 18 may be similarly bridged into the circuit by flowing solder across the gap (d).

The present invention safeguards the electronic apparatus from consumer misuse by preventing by-passing of the fuse element or re-fusing with an overrated fuse element. Additionally, due to the redundant fuse elements 16 and 18 being integrally formed upon the circuit board 12, the present invention eliminates the need for storing various proper sized and rated spare fuses thereby significantly reducing stocking requirements.

Thus, from the above, it may be recognized that the present invention provides a novel fuse, offering several significant advantages, yet only negligibly increasing production cost because of its formation directly on the mother circuit board 12 of the electronic apparatus during manufacture of the printed circuit 25, i.e., the primary cost incurred in the formation of the fuse being the minimal increase in artwork of the integrated circuit board 12 which would typically be amortized over the entire production run.

Shorting Cam Restorable Fuse

Referring to FIG. 2, an alternative embodiment of the present invention is illustrated wherein a restorable fuse assembly 30 is printed upon the circuit board 12 in the manner previously described.

In this particular embodiment, however, the fuse assembly 30 is provided with an elongated neck section 32 which is separated or disjoined intermediate its length. As in FIG. 1, the neck section 32 is preferably provided with a piece of dielectric material 37 which prevents metal particles freed during burnout from depositing at undesirable locations on the circuit board 12. A small aperture 34 (indicated by the phantom lines in FIG. 2) is formed through the circuit board 12 and is located within the separation of the neck 32. Disposed within the aperture 34 is a screw fastener 36 which mounts a shorting cam 38 against the fuse neck 32 and circuit board 12.

As can be seen, the shorting cam is formed in a reverse S-shaped or truncated elliptical configuration which permits the shorting cam 38, when manually rotated in a clockwise direction (as shown by arrow 35 in FIG. 2), to span the substantial length of the neck section 32. As shown in FIG. 2a, the shorting cam 38 includes a projecting angular tip 39 formed along periphery which forms a knife edge contact. When mounted on the circuit board 12, this projecting tip 39 penetrates through the dielectric material 37 and positively contacts the neck 32 of the printed fuse element 30.

In operation, the shorting cam 38 is initially positioned on the circuit board 12 (as illustrated in FIG. 2) so that the cam 38 contacts only a minimal length of the neck section 32. In this position, the shorting cam penetrates the dielectric material 37 and spans the neck separation thereby closing the circuit across the fuse element 30. Upon encountering current values, exceeding the amperage rating of the fuse element 30, the neck 32 will burnout as previously described, thereby breaking the circuit. Note that to accurately control the amperage rating of the fuse element 30, it is necessary that the edge of cam 38 completely shunts across the entire width of the neck section 32.

The applicant has discovered that due to the relatively large mass of the shorting cam 38 in relation to the neck section 32, the burnout typically occurs on the neck 32 in the close vicinity to the tip 39 of the cam 38.

Thus, after burnout, the fuse element 30 may be restored simply by loosening the screw fastener 36 and manually rotating the shorting cam 38 in a clockwise direction until the cam 38 again spans or bridges across the neck separation.

This procedure can be repeated after each successive burnout until the neck section 32 degrades to a shortened or minimal length which cannot be bridged by the shorting cam 38. Note to prevent the alteration of the current rating of the fuse element 30 in this form of the present invention, the length of the neck 32 is made greater than the maximum span of the cam 38, thereby prohibiting the cam 38 from directly contacting the lands 40 of the fuse element 30.

Therefore, in the embodiment of FIG. 2, the present invention provides an inexpensive restorable fuse element which provides consumer misuse of the electrical device.

Square Channel Multi-Element Fuse

In FIG. 3, a form of the printed circuit fuse assembly of the present invention is illustrated wherein four fuse elements 40 are produced in the manner previously described onto an insulating board which is fabricated as a square channel 46; each side of the channel 46 having one fuse element 40 formed thereon.

The square channel 46 is adapted to be frictionally engaged at both ends thereof by two U-shaped spring contacts 48 which are connected into the electrical circuit (not shown). As in the embodiment of FIG. 1, the neck section 44 of each printed fuse element 40 is provided with a piece of dielectric or other suitable material 47 which prevents the freeing of metal particles during burnout.

In this particular embodiment, one end of the fuse element 40 and the square channel 46 is coated with a thin electrical insulating film 42 which may be easily removed from the fuse element surface with a knife, coin or fingernail. Such materials are well known in the art and are commonly referred to as "solder masks," however other dielectric materials may be suitable for this application.

Before placing the square channel 46 into the U-shaped contacts 48, the user selectively scrapes or removes the solder mask 42 exclusively from one of the fuse elements 40 while retaining the mask on the remaining fuse elements. The user then positions the square channel 46 into the contacts 48, ensuring that the exposed fuse element 40 having the solder mask 42 removed therefrom interfaces one of the walls of the contact 48. Thus, due to the solder mask 42 insulating the fuse element 40 on the remaining three sides of the channel 46, only one fuse element 40 is connected into the circuit.

When the initial fuse element 40 burns out, the user installs a new fuse simply by removing the solder mask 42 from another fuse element 40 and reinserts the square channel into the contacts 48.

Printed Circuit Fuse Adapted to Prior Art Fuse Holder

Referring to FIG. 4, there is shown a form of a multiple printed circuit fuse assembly of the present invention adapted to be used in a standard prior art fuse holder (not shown). The printed fuse elements 50 are formed in a manner previously described. Advantageously, a flexible non-conductive substrate 52 is used such as the material solid by E. I. DuPont under the trademark KAPTON, which is capable of withstanding the photo resist etching or silk screening process.

As described supra in reference to FIG. 3, advantageously one end of the printed fuse elements 50 is located with a thin solder mask film 54 which serves as an electrical insulator.

Referring to FIG. 4a, the flexible substrate 52 with the fuse elements 50 thereon is wrapped upon a cylindrical mandrel 56 preferably fabricated from plastic or glass. This mandrel 56 supports the elements 50 and maintains the cylindrical configuration of the substrate 52 during use. A removable and fixed end cap 58 and 60 respectively are press-fit over the ends of the mandrel; cap 58 being oriented upon that end of the mandrel 56 having the solder mask film 54 thereon. It will be noted that the fixed cap 60 being press-fit over the mandrel 56 electrically contacts all of the fuse elements 50.

Referring to FIG. 4b, the particular construction of the removable end cap 58 is shown. As can be seen, the cap 58 is provided with a small indentation 62 which serves as an electrical contact. During the press-fit of end cap 58, indentation 62 attomatically scrapes off or removes the solder mask film 54 from whichever of the fused 50 is in alignment, the fuse elements 50 thereby providing an electrical connection exclusively with one particular fuse element 50.

Upon the subsequent burnout of the particular fuse element 50, the removable cap 58 is removed, realigned with another fuse element and press-fit back onto the mandrel 56, thereby restoring a new fuse.

It may be recognized that the embodiment of FIG. 4 may be modified to include a think insulating layer of dielectric or glass which covers the entire outside surface area of the fuse elements 50 and mandrel 56. By such modification, a user or technician could easily handle the fuse while connected in a circuit without the danger of possible electrical shock.

Alternatively, the flexible substrate 52 with the fuse elements 50 thereon may be bonded to the inside surface of the mandrel 56 thereby allowing the mandrel 56 itself to serve as an exterior insulator. The end caps 58 and 60 could then be modified to slidingly engage the inside diameter of the mandrel 56, with cap 58 including a small protrusion rather than the indentation 62.

Through Hole Plated Fuse

Referring to FIG. 5, an alternative form of the printed circuit fuse assembly of the present invention is shown comprising a pair of cylindrical printed fuse elements 70. For purposes of illustration, the two fuse elements 70 are depicted having a common series electrical connection. However, parallel connections can also be made without departing from the scope of the present invention.

Each of the cylindrical fuse elements 70 is formed by a through hole plating process. This process is commonly used in the electronics industry for external wiring of printed circuit boards. The basic process of through hole plating comprises the steps of drilling or punching a through aperture 74 in the circuit board 72 (better shown in FIG. 5a) and plating, during manufacture of the printed circuit 76 on both sides of the circuit board 72, a thin layer of metal 78 (typically a few mils in thickness) onto the cylindrical walls of the aperture 74 and in contact with the printed circuit 76.

In this embodiment of the present invention, such a through hole plated cylinder 78 functions as a fuse element. The electrical withstand rating of this fuse is a function of the cross-sectional area of the aperture 74 and thickness of the plating 78. As with the elongate printed fuse element of FIGS. 1 through 5, the accuracy of the fuse rating is readily controlled to high production tolerances by controlling the size of the aperture 74 and the plating process during manufacture.

As depicted in FIG. 5, with the two fuse elements 70 being connected in series, one will recognize that both fuse elements should theoretically burn out simultaneously upon encountering overcurrent. However, the applicant has discovered that due to minor discrepancies between the hole diameter, or plating thickness, such simultaneous burnout is virtually impossible. Thus, as will be described in more detail infra, by connecting the fuse elements 70 in series, a restorable fusing circuit is provided.

Referring to FIG. 5a, the method of reconnecting the printed circuit after burnout of one of the through hole plated fuse elements 70 of the present invention is illustrated wherein a shorting button 80 is inserted into the aperture 74 formed in the circuit board 72. The shorting button is an electrical conductor, preferably formed with a cylindrical shank 82 having a diameter slightly greater than the inside diameter of the plated fuse element 70, but less than the diameter of the aperture 74. One end of the shank 82 is provided with an annular chamfer 84, whereas the other end terminates at a shoulder 86, the diameter of which is greater than the diameter of the aperture 74.

To substitute a new fuse in place of a burnt fuse 70, shorting button 80 is manually inserted into the aperture 74 until the shoulder 86 contacts the top surface of the circuit board 72. In this position, the cylindrical shank 82 contacts the printed circuit 76 at its top and bottom edge respectively, thereby completing the circuit across the aperture 74. Thus, as shown in FIG. 5, with two fuse elements 70 connected in series, insertion of the shorting button 86 into the previously burned fuse element provides a jumper to the next fuse.

It should be noted that to prevent the accidental depositing of metal at undesirable locations of the circuit board 72 during burnout, the through hole plated fuse element 70 may be conveniently provided with a plastic insulator button (not shown) constructed similar to the shorting button 80, which is inserted into the fuse element 70 at manufacture. With the insulator button in place, all metal particles freed during burnout are prevented from traveling onto the circuit board 72 and instead fall downward through the aperture 74.

In-Line Printed Fuse

Referring to FIG. 6, there is shown the "in-line" printed fuse assembly 90 of the present invention designed to be used in a standard plug connector 92. Such standard plug connectors are well known in the art, being commonly known as quick disconnect "fast-on" connectors.

The "in-line" fuse assembly 90 is preferably formed on a phenolic or fiberglass circuit board blank 94 having an extending section 96 at both ends thereof. The width and thickness of these sections 96 are designed to fit snugly within the plug connector 92, thereby registering the fuse assembly 90 within the connectors 92.

Advantageously, the fuse assembly 90 comprises four printed fuse elements 98 (two located on the top side of the substrate 94 and two not shown being located on the bottom thereof). Each fuse element 98 has a central neck section 100 and a pair of land sections 102 at both ends thereof, printed onto the circuit board 94 in a manner previously described. In this embodiment, however, the land sections 98 are elongated and terminate at the ends of the extending section 96. Additionally, one of the extending sections 96 is coated with a thin insulating layer of solder mask 104.

Before inserting the "in-line" fuse 90 into the "fast-on" connectors 92, it is preferable for the user to remove the solder mask 104 from one of the lands 102' of the fuse element in the manner described supra. The "in-line" fuse 90 may then be inserted into both connectors 92. It will be noted that upon insertion, the one connector 92 which mates with the non-solder masked end of the "in-line" fuse electrically contacts all of the fuse elements 98, whereas the other connector only electrically contacts the one element 98, having the solder mask previously removed therefrom. Additionally, the applicant has found that to provide a positive electrical connection, the fuse element 98 being utilized should be aligned with one of the crimped edges 93 of the connectors 92. Thus, once inserted into the connectors 92, fusing of the circuit (not shown) is facilitated exclusively through that fuse element in which the solder mask 104 has been removed.

Similar to the manner previously described in reference to FIGS. 3 and 4, re-fusing after burnout may be accomplished by the user removing the solder mask 104 from one of the other fuse elements and reinserting the "in-line" fuse 90 into the plug connector 92.

Shorting Bar Restorable In-Line Fuse

FIGS. 7 and 7a illustrate another embodiment of the present invention for use in the standard dual prong (fast-on) plug connector of FIG. 6. In this embodiment, circuit board 114 includes two pairs of slots 116 at opposite ends thereof. These slots form insert tabs 118 which may be inserted into the plug connector 92 (as shown in FIG. 7a). A small aperture 120 is additionally provided in the circuit board blank 114 adjacent one of the insert segments 118.

Bonded to the circuit board 114 is the printed circuit fuse assembly of the present invention, preferably formed having two fuse buses 110 and 112. The printed fuse bus 110 is formed in a substantially inverted T-shaped configuration and includes a plurality of elongate fuse segments 122, 123, 124 and 125 having sequentially increasing lengths. The fuse bus 112 is formed in a substantially rectangular configuration and extends partially around the circumference of the small aperture 120.

A shorting bar preferably fabricated from metal having a slotted aperture 128 therethrough is mounted to the circuit board 114 and contacts the fuse bus 112. As can be seen, this shorting bar 126 may be located to bridge across the fuse buses 110 and 112 by contacting one of the elongate fuse segments 122 through 125. In the preferred embodiment, the circuit board 114 and the shorting bar 126 is coupled to the chassis 128 of the device (not shown) by a screw fastener 130 and standoff spacer 132 (as shown in FIG. 7a). This screw fastener 130 maintains the desired position of the shorting bar 126 relative the printed circuit board 114.

When initially placed in the plug connector 92, the shorting bar 126 is positioned to contact only the longest fuse segment 125 (as shown in FIG. 7). Should this fuse segment 125 burn out or vaporize during use, the consumer need only loosen the screw 130 and slide the shorting bar 126 forward through the slot aperture 128 to contact the next longest fuse segment 124. This position may then be maintained by retightening the screw fastener 130, thereby re-fusing the circuit (not shown). Similarly, this procedure may be repeated for each subsequent burnout until all of the fuse segments 122 through 125 are vaporized.

Since, as described supra, the current values of the printed circuit fuse elements are dependent only upon the width, thickness and composition of the fuse elements themselves, the varying lengths of the individual fuse segments 122 through 125 do not alter the desired amperage rating.

Fusable 3 Prong Plug Connector

Referring to FIG. 8, there is shown the printed circuit assembly fuse of the present invention mounted to a standard three-prong industrial plug connector 130 including conventional spade and ground terminals 132, 133 and 134 mounted to the plug 130 by three spade screws 136, 138 and 140. A thin insulator member 142 (shown cut away) having suitable apertures (not shown) formed therein to receive the spade and ground terminals 132, 133 and 134 covers the electrical connections to the spade screws 136, 138 and 140.

A printed circuit board wafer 144 (as shown in FIG. 8a) preferably formed of thin fiberglass or a flexible polymer is received by the plug connector 130. This wafer 144 is provided with two slotted apertures 146 and 148 and a semi-circular aperture 150 which receives the spade and ground terminals 132, 133 and 134 respectively during assembly. Three small screw apertures 152, 154 and 156 are additionally provided in the wafer 144 in alignment with the spade screws 136, 138 and 134 respectively (as shown in FIG. 8). Further, three wire apertures 162, 164 and 166 are formed adjacent the spade screw apertures 152, 154 and 156.

As can be seen, in FIG. 8b, each spade screw aperture 152, 154 and 156 is connected by a printed foil circuit 170 to its respective wire apertures 162, 166 and 164; each wire aperture preferably being through hole plated.

In relation to the spade screw apertures 152, the printed foil circuit 170 includes a printed multiple fuse circuit 172. This circuit 172 preferably comprises three individual fuse elements 174, 176 and 178 which are connected in a parallel circuit configuration at one end thereof. However, as in the embodiment of FIG. 1, only the fuse element 174 is manufactured shunting the spade screw aperture 152 and the wire aperture 162; the fuse elements 176 and 178 being redundant fuse elements separated from the printed circuit at their lower end thereof.

To assemble the circuit board wafer 144 to the plug connector 130, a three-wire conductor (not shown) is inserted through an aperture (not shown) in the small end of the plug 130. The individual wires w1, w2 and w3 may then be stripped, inserted and soldered into the wire apertures 162, 164 and 166 respectively of the wafer 144 (as shown in FIG. 8b).

The wafer 144 may then be inserted into the plug 130 by aligning the slotted and semi-circular apertures 146, 138 and 150 with the spade and ground terminals 132, 133 and 134. In this position, the spade screws 136, 138 and 140 may be inserted into the spade screw apertures 152, 154 and 156 respectively, thereby securely mounting the wafer 144 to the plug 130. Subsequently, the insulator cover 142 is replaced onto the plug 130 to prevent against any accidental electrical shock to the user.

As will be noted, due to the printed circuitry 170, electrical connections between the wires w1, w2 and w3 and the spade and ground terminals 132 through 134 is facilitated with the plug 130 being self-fused by the printed circuit fuse element 174.

The operation and re-fusing of the plug 130 may be easily accomplished in the manner discussed supra in reference to FIG. 1, wherein after burnout of the fuse element 174, the user may connect either of the fuse elements 176 or 178 by simply soldering across the separation, thereby connecting a new fuse element into the circuit.

Thus, with the embodiment of FIG. 8 of the present invention, a consumer may protect a particular electrical device against overload current by merely substituting the plug 130 for the conventional plug.

In FIG. 8c, an alternative means of re-fusing the plug connector of FIG. 8 is illustrated. In this embodiment, the printed fuse elements 174, 176 and 178 as shown in FIG. 8 are replaced by three printed fuse elements 180, 182 and 184 located concentrically around the spade screw 136 and connected to the wire aperture 162.

A rectangular shorting bar 186 is rotatably mounted to the wafer 144 and secured in position by the spade screw 136. As may be easily recognized, the shorting bar 186 completes the printed fuse circuit between the spade screw 136 and wire aperture 162 by selectively contacting one of the fuse elements 180, 182 and 184. In the initial position (as shown in FIG. 8c), the shorting bar contacts the fuse element 180, thereby fusing the plug 130. When this fuse element 180 burns out, the user may loosen the spade screw and rotate the shorting bar 186 to contact the next fuse element 184. This procedure may similarly be repeated for the fuse element 182, thereby allowing re-fusing simply and easily.

While the fused plug connector 130 is of general utility, its convenience and safety makes it especially useful for consumer products. Thus, manufacturers of electrical appliances, extension cords and the like may offer their products for sale with such a plug permanently installed with two important assurances: the first being that if an over circuit condition occurs, the fuse will blow before the appliance or cord is harmed and the second being that the consumer cannot conveniently install an unsafe fuse of higher amperage without leaving telltale evidence such as physical removal of the fused plug.

Printed Fuse Module

Referring to FIG. 9, there is shown another form of the present invention wherein a multiple printed fuse module 190 may be used to fuse an electrical device (not shown).

As shown in FIG. 9, the fuse module 190 preferably includes a rectangular circuit board 192 having four fuse elements 194 printed thereon. The printed fuse elements 194 are formed as previously described having a central neck section 198 and a land section 199 at both ends thereof. The circuit board 192 additionally is provided with a small aperture 196 which is centrally located in the module 190.

Referring to FIG. 9b, a fragmentary view is illustrated of the circuit board 200 of the device (not shown). The circuit board 200 includes a small aperture 202 which aligns with the aperture 196 of the fuse module 190 during mounting. The circuit board 200 is further provided with two printed contacts 204 and 206, which are symmetrically spaced from the aperture 202 and connected with the remainder of the printed circuit (not shown).

The printed fuse module 190 is mounted face down upon the circuit board 200 of the device, as shown in FIG. 9c and retained in position by a screw fastener 205 which is inserted through the apertures 196 and 202. Properly positioned, the printed contacts 204 and 206 contact only the land section 199 of the printed fuse elements 194; with the neck section 198 spanning the space between the two contacts 204 and 206 on the circuit board 200. Thus, the circuit board 200 is fused across the printed contacts 204 and 206 by the printed fuse element 194.

When the initial fuse element 194 is burned out or vaporized, re-fusing may be accomplished by loosening the screw 205 and rotating the fuse module 190 through a 90° arc. This rotation positions a new fuse element 194 of the fuse module 190 across the printed contacts 204 and 206. This procedure may be similarly repeated until all of the fuse elements 194 are burned out or spent.

Thus, by use of the printed fuse module 190, a manufacturer may provide for multiple fusing of a device without the need of external wiring connections.

Edge Contact Clip Restorable Fuse

As shown in FIG. 10, another form of the multiple element printed circuit fuse assembly 210 of the present invention is formed along the edge of a printed circuit board 212 and connected to the leads 220 and 222 of an electronic circuit (not shown) which are desired to be fused. The multiple element printed circuit fuse 210 includes three fuse elements 214, 215 and 216, as well as two fuse buses 218 and 220. As in the embodiment of FIG. 1, only one fuse element 214 is connected between the two fuse buses 210 and 220, the remaining fuse elements 215 and 216 providing redundant fuse elements. Thus, as previously described, the fuse element 214 provides the initial fusing of the printed circuit leads 220 and 222.

When fuse element 214 burns out of vaporizes due to an excess current associated in the circuit, reactivation of the printed circuit fuse 210 is easily accomplished by entering either of the redundant fuse elements 215 and 216 into the circuit by use of the edge contact clip 224. This edge contact clip 224 is preferably formed of thin copper stock and clamps tightly against the top and bottom surfaces of the circuit board 212. Two dimple edges 225 and 226 are additionally formed on the clip 224 and are aligned to contact the bus 220 and one end of the fuse element 215 or 216 respectively. As shown, clip 224 may be conveniently stored on the edge of the circuit board adjacent the multiple fuse elements 210.

To re-fuse the multiple element printed circuit fuse 210 after burnout of the original fuse element 214, the contact clip 224 is simply positioned along the edge of the circuit board 212 such that it aligns with one of the redundant fuse elements 215 or 216. When aligned in such a manner, the dimple edges 225 and 226 and clip 224 positively bridges the fuse bus 220 with one end of the redundant fuse elements 215 or 216, thus connecting one of the fuse elements 215 or 216 across both fuse buses 218 and 220. Therefore, in the embodiment of FIG. 10, the present invention allows the user or a service technician to reactivate the multiple fuse element 210 without the need of soldering or external wiring connections.

Printed Circuit Fuse Path

Referring to FIG. 11, there is shown an alternative form of the present invention utilized to fuse an existing circuit board 230 of an electrical device (not shown) having a circuit 232 printed thereon. In this embodiment of the present invention, a printed circuit fuse patch 236 is aligned and connected to the printed circuitry 232 to provide a multiple element printed fuse circuit.

Referring to FIG. 11a, the detailed construction of the printed fuse patch 236 may be seen. The patch 236 is formed from a thin, rectangular, flexible insulating substrate 238 having formed thereon a multiple foil fuse element 240. The fuse element 240 preferably includes three fuse elements 246, 248 and 250, as well as two fuse buses 242 and 244, which extend beyond the edges of the substrate 238 at opposite ends thereof. As in the embodiments of FIGS. 1 and 10, only one fuse element 246 is connected across the fuse buses 242 and 244, the remaining fuse elements 248 and 250 providing backup or redundant fuse elements.

The fuse patch 236 is additionally provided with a thin transparent laminate 252 (best shown in FIG. 11b), thereby providing a sandwich-like configuration to the patch 236. This laminate 252 serves as an electrical insulator for the patch 236 and aids in retaining the bond between the foil fuse element 240 and the substrate 238. The laminate 252 preferably includes two small cutouts or apertures 254 and 256 as shown in FIG. 11a. As will be described in more detail infra, these apertures provide access to the foil fuse elements 248 and 250 during re-fusing.

The installation of the fuse patch 236 upon the printed circuit 232 of the circuit board 230 is accomplished as follows: Referring to FIG. 11b, the printed circuit 232 is interrupted along its length at 234 by removing a section of foil circuitry. The patch 236 is then placed over this cutout 234 and the foil extensions 242 and 244 of the fuse buses are aligned with the printed circuit 232. The patch is then connected to the circuit 232 and retained against circuit board 230 by soldering the foil extensions 242 and 244 to the printed circuit 232. Thus, once maintained in position, the patch 236 provides a multiple fusing element for the circuit 232.

As in the embodiment of FIG. 1, when the fuse element 246 burns out or vaporizes due to high current values in the circuit, reactivation of the fusing circuit may be simply accomplished by inserting either one of the redundant fuses 248 and 250 into the circuit. As previously described, this connection may be facilitated by a solder bridge which spans across the fuse bus 242 to either of the fuse elements 248 or 250. Additionally, due to the apertures 254 and 256 of the laminate 252 being positioned over one end of the redundant fuse elements 248 and 250, this soldering may be readily accomplished without the need of removing the transparent laminate 252.

Thus, as can be seen, the fuse patch 236 of the present invention enables any circuit board to be fused by the user or service technician with a restorable multiple fuse printed circuit element.

Dual In-Line Printed Circuit Fuse

In FIG. 12, a dual in-line fuse element 260 is illustrated. In this form of the present invention, the fuse element 260 includes a substrate board 262 having a slot 264 at each end thereof. Each slot 262 forms a pair of extending sections 266 which are slidably received by a fast-on plug connector (as shown at 92 in FIG. 6).

Two separate printed fuse circuits 270 and 272 (shown schematically in FIG. 12a) are formed on the substrate board 262 in a manner previously described and are each preferably provided with two fuse elements 274 and 276 respectively. As shown, only the fuse elements 274 are connected in the fuse circuits 270 and 272; the fuse elements 276 being redundant fuse elements.

In this embodiment, the two fuse circuits 270 and 272 may be conveniently utilized to fuse two separate circuits (not shown) or alternatively be connected in series to fuse a single circuit, thereby providing increased circuit protection.

Upon burnout of either of the fuse elements 274, reactivation of the circuit may be accomplished by the solder bridge manner previously described. Additionally, although for illustration, the dual in-line fuse element 260 includes fusing circuits on only one side of the substrate board 262. A similar fusing circuit may be provided on both sides of the board, thereby providing a parallel fusing network.

Edison Base Printed Fuse Disk

Referring to FIG. 13, there is shown a standard Edison base electrical outlet 280 modified with the printed circuit fuse disc 288 of the present invention.

The electrical outlet 280 is provided with an internally threaded bushing 282, base 284, and dual mounting holes 286. Two electrical terminals 290 and 292, which provide for the external wiring connections (not shown) of the outlet 280, are located at the bottom of the bushing 282 and are mounted on an insulating board 294. As is well known in the art, these terminals 290 and 292 are connected to the spring contact 296 and the threaded bushing 282, respectively, and provide the primary electrical terminals for an electrical load, such as an incandescent light bulb (not shown).

In this embodiment, the printed circuit fuse disc 288, preferably formed of a thin fiberglass or semi-flexible polymer material, is sized to be inserted directly into the threaded bushing 282. The top surface of the disc 288 includes a printed fuse circuit 300 formed in a manner previously described having two circular buses 302 and 304 and a plurality of fuse elements 306 which are connected to the bus 302 and extend radially inward toward the bus 304. As may be seen in FIG. 10, one of the fuse elements 306A is preferably connected across both buses 302 and 304 at manufacture with the remaining fuse elements 306 terminating adjacent the bus 304 forming a gap or separation (d). A small plated through hole 308 is formed through the disk 288 and is electrically connected to the bus 302.

As shown in FIG. 13A, the underside of the disc 288 includes a printed contact 310 having a short printed segm 312 which extends to the aperture 308. Thus, as may be easily understood, the plated through hole 308 electrically connects the printed contact 310 located on the underside of the disc 288 with the fuse bus 302 and printed circuit 300 formed on the top surface of the disc 288. It should be noted that in this embodiment the plated through hole 308 does not function as a fuse element as described in relation to FIG. 5, but rather forms a permanent electrical connection between the printed circuits formed on opposite sides of the disc 288.

In operation, the disc 288 is inserted into the threaded bushing 282 of the Edison base 280 and oriented such that the printed contact 310 of the disc 288 rests against the spring contact 296. Since the disc 288 is formed from an insulating substrate, the two terminals 290 and 292 of the base 280 remain electrically independent or isolated from each other.

Once the disc 288 is inserted, an electrical load, such as an incandescent light bulb (not shown), may be threaded into the aperture 282, so that it's central contact seats against the circular bus 304, thereby maintaining the disc 288 in proper position. The insulating outer perimeter of the disc 288 insulates the printed circuits from the bushing 282.

As may be easily recognized, the use of the disc 288 fuses the Edison base 280 by forming a current path through the fuse element 306A. When the initial fuse element 306A is burned out or vaporized due to overcurrent, re-fusing may be accomplished in a manner previously described by flowing solder or otherwise electrically bridging the gap (d) between another of the redundant fuse elements 306 and the bus 304.

Thus, by use of the printed fuse disc 288, a consumer can easily and economically fuse an Edison base electrical socket. Additionally, it should be noted that the fuse disc can also be utilized in a variety of other applications wherein a standard Edison base socket is provided, i.e., fuse boxes, extension cords, or like sockets.

Referring to FIG. 13B, a modified form of the fuse disc 288 of FIG. 13 is shown, wherein a shorting bar 314 is utilized for restoring the fuse circuit 300 after burnout. The printed circuit formed on both the top and undersides of the disc 288 is the same as shown and described in FIG. 13 except that all of the fuse elements 306 terminate adjacent the central fuse bus 304 (as shown in FIG. 13) forming the gap (d). Additionally, in this embodiment, a shorting bar 314 is rotatably mounted on the top surface of the disc 288 and positioned about its central axis.

Referring to FIG. 13C, the assembly of the shorting bar 314 with the disc 288 is shown. The shorting bar 314 includes an aperture 316 which is aligned with the small central aperture 318 extending through the disc 288. A rivet 320 is inserted through the aperture 316 and press-fit into the aperture 318. The diameter of the aperture 316 is formed slightly greater than the diameter of the aperture 318 such that the shorting bar 314 may be rotated about the stationary rivet 320.

As may be recognized, the rivet 320, as well as the shorting bar 314, must be an electrical conductor to complete the fusing circuit between the fuse elements 306 and the bus 304 (as shown in FIG. 13). Additionally, the rivet 320 must terminate above the lower surface of the disc 288 so as to prevent any direct electrical contact with the spring contact 296 of the Edison base 280.

In operation, the shorting bar 314 is initially aligned with one of the fuse elements 306a and the disc is then inserted into the Edison base 280 in the manner previously described. When the initial element 306 is burned out, re-fusing or restoration may be easily accomplished by removing the disc 288 from the base 280 and then manually rotating the shorting bar 314 through a ninety-degree arc. This rotation positions a new fuse element 306 across the fuse buses 302 and 304 thereby restoring the fuse circuit. This procedure may be similarly repeated until all of the fuse elements 306 are spent. Thus, by use of the present invention, as embodied in FIGS. 13, a standard Edison base electrical outlet may be fused to prevent current overload.

Fusable Plug-In Triple Outlet

In FIG. 14, there is shown a standard "plug-in" triple outlet 320 typically used in residential electrical applications modified with the printed circuit fuse of the present invention. Such standard plug-in outlets are well known in the art, one of which is being currently marketed under the name "Trim-Fit" by General Electric and Levitron Manufacturing Company. The outlet 320 includes a pair of male duplex plug prongs 322 on one edge thereof which are preferably hinge mounted to the base member 321 of the outlet 320. Three pairs of female plug receptacles 324 are electrically connected to the male prongs 322 and are located on the respective remaining edges of the base member 321.

As will be described in more detail infra, the outlet 320 includes a printed fuse circuit board 328 which provides both a master fuse for the entire outlet 320 as well as separate fuses for each female receptacle 324, thereby effectively preventing the possibility of fire caused by accidental overloading of the circuit (not shown). A transparent cover plate 330 having a series of slide switches 326 mounted thereon is additionally provided to register and maintain the printed circuit board 328 against the base member 321. The slide switches 326 conveniently provide a fuse-off position as well as two or more fuse-on positions which allow easy re-fusing or restoration of the entire device 320 and each receptacle 324 after burnout.

Referring to FIG. 14A, the detailed construction of the base member 321 of the present invention is illustrated. The base 321 is preferably fabricated from a phenolic or plastic material and is formed in a rectangular configuration having raised sidewalls 333. A rectangular slot 331 is formed at the top edge of the base 321 and provides a swivel aperture for a pair of duplex plug prongs 322. The prongs 322, typically formed of thin metal strips, are pivotally mounted by a pair of rivets 332 to two stationary L-shaped spring contacts 334.

As may be seen, the spring contacts 334 are maintained in position on the base 321 by engaging at each end thereof a pair of integrally formed mounting legs 336 and 338 which rise vertically to the height of the sidewalls 333 of the base 321. The lateral spacing between the duplex plug prongs 322 is insured by use of a U-shaped insulating spacer 341 which swivels with the plug prongs 322 and urges the spring contacts 334 against the mounting legs 336. Thus, as may be recognized, the duplex plug prongs 322 may be swiveled through a 180-degree arc while maintaining a positive electrical connection with the spring contacts 334.

On each of the remaining edges of the base 321, a pair of female plug receptacle slots 324 are formed in the sidewalls 333 (better shown in FIG. 14). As may be easily recognized, these slots 324 provide for the insertion of a standard male plug terminal (not shown) into the base member 321. The base 321 additionally includes a retainer boss 346, a pair of mounting pins 344, and a mounting leg 342 adjacent each receptacle slot 324.

Disposed on the interior of the sidewalls 333 and aligned with each pair of slots 324, are a pair of L-shaped spring contacts 340 which provide the electrical connections to the female plug receptacles 324 of the outlet 320. One leg 340A of the spring contacts 340 is fabricated having a substantially straight length whereas the other leg 340B is provided with a convex configuration. The straight leg length 340A is securely maintained against the sidewall 333 of the base 321 by the mounting leg 342 and pin 344. With the spring contact 340 mounted against the sidewall 333, the convex leg 340B is self-biased against the retainer boss 346.

When a standard male plug connector (not shown) is inserted into each of the slot 324, the convex legs 340B are forced outwardly from the boss 346 and assume a position against both pins 344 as indicated by the phantom lines 348. It may be recognized that in this position each spring contact 340 positively contacts the inserted male plug connector of an electrical appliance (not shown).

The internal electrical connections between the male plug prongs 322 and the various pairs of spring contacts 340 is provided by the printed fuse circuit board 328 of the present invention. Referring to FIG. 14B, the top surface of the printed fuse circuit board 328 is illustrated.

As in the previous embodiments, the circuit board 328 may be preferably formed of a fiberglass polymer sheet which serves as an electrical insulator. The board 328 is formed in a substantially rectangular configuration and is sized to the same outside dimensions as the base member 321. Additionally, a notch 353 is provided at the top edge thereof and is located to register with the similar notch 331 of the base member 321.

A printed circuit 350 is formed on the board 328 and includes a master fuse array 352 and three receptacle fuse arrays 354 electrically interconnected by a common fuse bus 356. Both the master and receptacle fuse arrays 352 and 354, respectively, include one or more fuse elements 358 formed in a manner as previously described. Each of the fuse elements 358 are connected at one end thereof to a fuse bus 360; and terminate adjacent the common bus 358 at their other end forming a small separation or gap (d).

As will be described in more detail infra, the slide switches 326 (as shown in FIG. 14) are aligned with this gap (d) during assembly and provide a bridging means to electrically shunt the fuse elements 358 across the common bus 356.

Figure 14C:
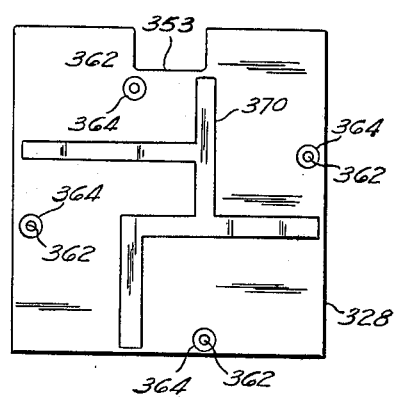
FIG. 14c is a plan view of the undersurface of the printed circuit board of FIG. 14b.

Each fuse bus 360 includes a plated through hole 362 which extends through the board 328 and forms a printed contact pad 364 on the bottom side of the board 328 (as shown in FIG. 14C). When the board 328 is mounted to the base member 321 (described infra) these contact pads provide a positive electrical connection to a respective one of each pair of spring contacts 334 and 340.

Referring to FIG. 14C, the bottom or back surface of the printed fuse circuit board 328 is shown. The back surface includes a printed circuit 370 formed in a manner previously described, which initiates adjacent the lower edge of the notch 353 and extends towards each of the respective edges of the board 362.

As may be seen, the location of the printed circuit 370 on the board 328 is such that the distance at the edges of the board 328 between the printed circuit 370 and each of the adjacent printed contact pads 364 corresponds to the lateral spacing between the pairs of spring contacts 334 and 340. Thus, as will become more apparent, with the board 328 mounted to the base member 321, the printed contact pads 364 and the printed circuit 370 electrically contact each respective pair of spring contacts 334 and 340.

Figure 14D:
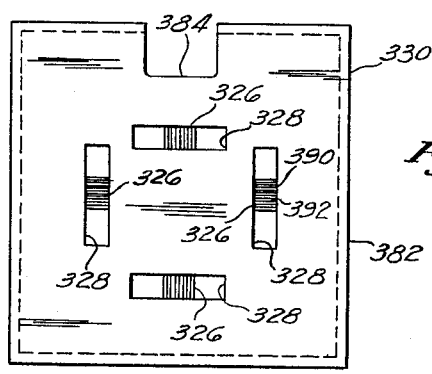
FIG. 14d is a plan view of the transparent cover plate of the "plug in" triple outlet of FIG. 14.

Referring to FIG. 14D, there is shown a cover plate 330 which registers and mounts the printed fuse circuit board 328 to the base member 321. The cover 330 is formed having a raised edge 382 which extends along its periphery and includes a small notch 384 at its top edge thereof. The cover plate 330 is preferably fabricated from a transparent plastic material which provides an electrical insulator and also allows for exterior inspection of the top surface of the printed circuit board 328.

The plate 330 additionally includes four slide switches 326 which are mounted in rectangular apertures 328 formed in the plate 380a. Each switch 326 includes a small finger element 390 having a knurled top surface 392 and a contact plate (not shown) on the bottom surface thereof. Additionally, the switches are preferably formed with an indent indexing mechanism (not whosn) which provides discrete three position switching throughout the entire travel of the slide switch. Such slide switches are well known in the art and are commercially available from a variety of sources. As will be described in more detail below, in the preferred embodiment these three-position switches 326 are utilized to provide a fuse-off and two fuse-on positions.

The assembly and operation of the fusable plug-in triple outlet 320 may not be described. As shown in the composite view of FIG. 14, the printed fuse circuit board 328 is registered and placed upon the base member 321 such that the printed contact pads 364 and printed circuit 370 formed on the bottom surface of the board 328 (as shown in FIG. 14C) are pressed tightly against the respective spring contacts 334 and 340 mounted on the base 321 (as shown in FIG. 14B). The transparent cover plate 330 is then placed over the circuit board 328 and base member 321 assembly and is secured to the base member along its periphery by an appropriate adhesive bond, snap retainer, or sonic welding.

In this position, each slide switch 326 is disposed along the gap (d) formed between the respective fuse elements 358 and the common bus 356, as indicated by the phantom lines 386 in FIG. 14B. As such, the contact plate (not shown) formed on the underside of the finger element 392 of the slide switches 326 provides a selective bridging means for spanning the gap (d) between the individual fuse elements 358 and the common bus 356 thereby selectively closing the printed fuse circuit 350.

It will be recognized that when assembled, the printed circuits 350 and 370, formed on opposite sides of the printed fuse circuit board 328, electrically connect the duplex prongs 322 with each of the respective spring contacts 340, located adjacent the female receptacle apertures 324. Additionally, it may be understood that the master and receptacle fuse arrays 352 and 354 (as shown in FIG. 14B) provide fuse protection for the entire outlet 320 as well as the individual receptacles 324, respectively.

As previously mentioned, the slide switches 326 preferably include a three-position detent mechanism (not shown). In operation, the first two discrete positions of the switch (as indicated by the phantom lines i and ii respectively in FIG. 14b) may advantageously coincide with the two elements 358 of both the master and receptacle fuse arrays 352 and 354, respectively. Thus, in either of the first two positions, the contact plates (not shown) of slide switches 326 bridge across the gap (d) thereby fusing the entire device 320 and each of individual receptacles 324 through the fuse elements 358. However, in the third position, (indicated by the phantom lines iii in FIG. 14b) the switches 326 fail to contact a fuse element 358, and thereby fail to close the printed circuit 350 between the fuse buses 360 and common bus 356 (as shown in FIG. 14B). Thus, in this third position, electrical power to each of the receptacles 329 is eliminated. Therefore, it may be easily recognized that the three-position switches 326 provide a fuse-on/fuse-off manual control for the plug-in outlet 320.

Additionally, the three-position switches 326 provide a convenient method of re-fusing the printed circuit 350. As described supra, the printed fuse elements 358 of the present invention burn out or vaporize when exposed to electrical over-current. When such a fuse burnout occurs in the use of the plug-in outlet 320, the user may restore the outlet 320 by simply manually moving the appropriate switch 326 to contact the other fuse elements 358 of the master or receptacle fuse arrays 352 and 354, respectively. Thus, when moved in this manner, the switch again bridges the gap (d) between the fuse element 358 and the common bus 356 (as shown in FIG. 14B) thereby restoring the circuit to the outlet 320.

The applicant has found that by coating each fuse element with a layer of heat-sensitive material, which changes color permanently upon variations in temperature (described supra), a user may easily observe, through the transparent cover plate 330, the particular fuse element 358 which is vaporized. Thus, upon observation, the user may simply move the appropriate switch 326 to restore a new fuse element 358.

Additionally, it will be recognized that by forming the master fuse array 352 to provide a higher current rating than the receptacle arrays 354, fuse burnout will normally occur in the receptacle arrays 354, thereby insuring a long life for the entire plug-in outlet 320. Further, the applicant has discovered that the plug-in outlet 320 may be conveniently provided with a snap-on cover plate 330, thereby allowing the use of replacement printed fuse circuit boards 328 after the multiple fuse arrays burn out.

Therefore, from the above, it can be recognized that the present invention provides an economical, multiple plug-in outlet which effectively prevents the possibility of fire caused by an overloaded circuit by use of a printed circuit fuse assembly.

In-Line Fuse Roll

In FIG. 15, an in-line multi-element fuse roll 400 is shown. In this form of the present invention the fuse roll 40 includes a plurality of fuse elements 402 (as shown in FIG. 15A and indicated in phantom lines in FIG. 15) which are formed by one of the various production processes previously described on a flexible non-conductive substrate 404. As in the embodiment of FIG. 4, the applicant has found that the material Kapton, a Registered Trademark of E. I. DuPont, is extremely suitable for this application due to its capability of withstanding the photo-resist etching process.

As shown in FIG. 15A, the fuse roll 400 is initially fabricated in a flat, planar configuration and includes a printed fuse circuit 406 composed of a plurality of fuse elements 402 and two fuse buses 408 and 410. The fuse elements 402 are connected at one end thereof to the fuse bus 408 and extend toward the fuse bus 410. As may be seen, one of the fuse elements 402A is preferably connected across both fuse buses 408 and 410 at manufacture with the remaining fuse elements 402 terminating adjacent the bus 410. Each fuse bus 408 and 410 extends to opposite ends of the substrate 404 thereby conveniently allowing use of external connectors to the printed fuse circuit 406.

Advantageously the substrate may be provided with a pair of slots 412 adjacent the ends of each fuse bus 408 and 410 which receive a standard "Fast-On" plug connector 414 (shown in FIG. 15). As previously described, the width and thickness of the land between the slots 412 are designed to fit snugly within the plug connector 414, thereby registering the fuse buses 408 and 410 within the connector 414. Alternatively, standard external connections can be made to the fuse buses 408 and 410 and secured thereto by soldering or riveting.

As depicted in FIG. 15, before inserting the substrate 404 into the connectors 414, the substrate is rolled into a tube-like configuration which is maintained by an insulator collar 416. As may be recognized, in this rolled configuration the printed circuit 406 is maintained exclusively on the inside of the roll, thereby completely insulating the fuse roll 400 without the necessity of using an insulating shel or covering.

In operation, after the initial fuse element 402A vaporizes, a user or service technician can restore the fuse roll 400 by simply sliding the collar 416 off the roll 400, unrolling the substrate 404, and bridging one of the redundant fuse elements 402 across the fuse bus 410. As previously mentioned, such bridging can be accomplished by flowing solder or other suitable technique. The substrate 404 may then subsequently be rolled back into the tube-like configuration and the collar 416 may be replaced. Similarly, this procedure may be subsequently repeated for each remaining fuse element 402 until all of the elements 402 are spent.

Single Element Printed Circuit Fuse Providing Consumer Misuse History

Referring to FIG. 16, a single element printed circuit fuse 420 of the present invention is shown formed directly upon a mother or primary printed circuit board 422. As in the embodiment of FIG. 1, the mother circuit board 422 typically includes a variety of electrical components, such as a resistor 424, capacitor 426, and an integrated circuit 428, which are connected together to form a composite printed circuit 420 of an electrical device (not shown). However, in this embodiment, the printed circuit fuse 420 of the present invention may be connected in series with a standard prior art fuse 432 (shown schematically in FIG. 16) which is mounted in a conventional manner upon the circuit board 422. By use of both the printed and conventional fuses 420 and 432, respectively, the applicant has found that a permanent record or history of consumer misuse of the device is provided on the circuit board 422.

In the preferred embodiment, the printed fuse element 420 is purposely designed having a higher current rating than that of the conventional fuse 432. For exmaple, the printed fuse 420 could be rated at 35 amperes whereas the conventional fuse 432 would be rated at 30 amperes. Thus, upon encountering an initial over-current, the 30-ampere conventional fuse would open the circuit before vaporization of the 35-ampere printed fuse element. The consumer could then exchange the conventional fuse 342 with a proper rated replacement and continue using the device.

However, in those instances where the consumer deliberately exchanges the burnt fuse 342 with an over-rated replacement, continued over-rated use of the device would cause the printed circuit fuse 420 to vaporize. Thus, irrespective of the consumer attempting to conceal such misuse by replacing the over-rated conventional fuse with a proper fuse, the manufacturer could easily detect the misuse by observing the condition of the printed circuit fuse 420.

In many instances, this misuse history would prevent fraudulent warranty claims against manufacturers of the electrical device. Additionally, since, as previously mentioned, the printed circuit fuse 420 may be formed at the same time and in the same manner as the composite printed circuit 430, this consumer misuse history could be provided with only a negligible increase in production cost to the manufacturer. Further, the manufacturer could easily repair the device by either bypassing the burned printed fuse element or replace the element with a fuse patch as shown in FIG. 11.

Thus, from the above, it is apparent that the printed circuit fuse assembly of the present invention completely eliminates the storage, cost, and misuse deficiencies associated in the prior art by providing a reliable and inexpensive fuse assembly which may be versatilely utilized by both the manufacturer and the consumer.

What is claimed is:

1. In an electrical device having a printed circuit board including a plurality of electrical components, such as a resistor, capacitor, integrated circuit, or the like, which are combined to form a printed circuit, an improved fuse assembly comprising:
    a conventional fuse having a predetermined current rating electrically connected to said printed circuit;
    a thin printed fuse element having a predetermined fuse rating higher than said rating of said conventional fuse formed integral with said printed circuit and connected in series with said conventional fuse; and
    said thin fuse element, upon burn-out, providing a permanent record on said circuit board of consumer mis-use of said electrical device caused by the bypass or improper replacement of said conventional fuse.

2. The improved fuse assembly of claim 1 wherein said thin fuse element is formed at the same time and with the same process as used to the manfacturing of said printed circuit.

3. In an electrical device having an electrical circuit including a plurality of electrical components, an improved fuse assembly comprising:
    a current actuated first fuse having a predetermined current rating for protecting said electrical circuit, said first fuse accessible to the user of said electrical device to permit replacement thereof by said user;
    a current actuated second fuse connected in series with the first fuse and measuring the same current, having a predetermined current rating higher than said current rating of said first fuse for protecting said circuit in the event of misuse of said electrical device by said user caused by the bypass or improper replacement of said first fuse;
    said fuses connected in said circuit to interrupt power to said circuit upon burn-out of either of said fuses; and
    said first fuse interrupting power to said circuit in preference to said second fuse for all overload current conditions of said electrical device.

4. In an electrical device having an electrical circuit including a plurality of electrical components, an improved fuse assembly, comprising:

first circuit interrupting means, for opening said circuit at a first predetermined current level to protect said circuit;

second circuit interrupting means connected in series with the first circuit interrupting means and measuring the same current, for opening said circuit at a second predetermined current level, higher than said first predetermined level, for protecting said circuit in the event of misuse of said first circuit interrupting means by a user;

said first circuit interrupting means opening said circuit in preference to said second circuit interrupting means for all overload current conditions of said electrical device, and said first circuit interrupting means easily replaceable or resettable by said user, said second circuit interrupting means less easily replaceable or resettable by said user than said first circuit interrupting means to provide a record of misuse of said first interrupting means.

* * * * *